(12) United States Patent
Cheng

(10) Patent No.: US 8,607,130 B2
(45) Date of Patent: Dec. 10, 2013

(54) COMPUTATIONALLY EFFICIENT CONVOLUTIONAL CODING WITH RATE-MATCHING

(71) Applicant: Telefonaktiebolaget L M Ericsson (Publ), Stockholm (SE)

(72) Inventor: Jung-Fu Cheng, Fremont, CA (US)

(73) Assignee: Telefonaktiebolaget L M Ericsson (Publ), Stockholm (SE)

( * ) Notice: Subject to any disclaimer, the term of this patent is extended or adjusted under 35 U.S.C. 154(b) by 0 days.

(21) Appl. No.: 13/687,903

(22) Filed: Nov. 28, 2012

(65) Prior Publication Data

US 2013/0091407 A1   Apr. 11, 2013

Related U.S. Application Data

(63) Continuation of application No. 13/412,402, filed on Mar. 5, 2012, now Pat. No. 8,347,196, which is a continuation of application No. 12/133,498, filed on Jun. 5, 2008, now Pat. No. 8,266,508.

(60) Provisional application No. 60/942,770, filed on Jun. 8, 2007.

(51) Int. Cl.
*H03M 13/03*     (2006.01)
*G06F 11/00*     (2006.01)

(52) U.S. Cl.
USPC .......................................... 714/786; 714/701

(58) Field of Classification Search
USPC .......................... 714/701, 786, 790; 370/315
See application file for complete search history.

(56) References Cited

U.S. PATENT DOCUMENTS

| | | | |
|---|---|---|---|
| 6,665,833 B1 * | 12/2003 | Tong et al. | 714/790 |
| 6,744,744 B1 * | 6/2004 | Tong et al. | 370/320 |
| 6,751,772 B1 * | 6/2004 | Kim et al. | 714/786 |
| 7,478,312 B2 * | 1/2009 | Nagase et al. | 714/790 |
| 2005/0053168 A1 | 3/2005 | Song et al. | |
| 2008/0301536 A1 * | 12/2008 | Shin et al. | 714/786 |
| 2008/0307293 A1 * | 12/2008 | Cheng | 714/790 |

FOREIGN PATENT DOCUMENTS

| | | | | |
|---|---|---|---|---|
| EP | 1045 521 A2 * | 10/2000 | | H03M 13/00 |
| EP | 1045521 A2 | 10/2000 | | |
| EP | 1511209 A2 * | 3/2005 | | H04L 1/00 |
| EP | 1511209 A3 | 3/2005 | | |
| EP | 1 545 036 A1 * | 6/2005 | | H04L 1/00 |
| EP | 1545036 A1 | 6/2005 | | |
| JP | 2005-73266 A | 3/2005 | | |
| WO | WO00/19618 A1 | 4/2000 | | |
| WO | WO 02/062002 A1 * | 8/2002 | | H04L 1/00 |
| WO | WO02/062002 A1 | 8/2002 | | |

OTHER PUBLICATIONS

"Convolutional code rate matching in LTE", Source: Motorola, 3GPP TSG RAN1 #48bis, RI-071324, Mar. 26-30, 2007, whole document.

(Continued)

*Primary Examiner* — Shelly A Chase

(57) ABSTRACT

An error coding circuit comprises a non-systematic convolutional encoder for coding an input bit stream to produce two or more groups of parity bits, an interleaver circuit for interleaving parity bits within each group of parity bits, and a rate-matching circuit for outputting a selected number of the interleaved parity bits ordered by group to obtain a desired code rate.

16 Claims, 5 Drawing Sheets

(56) References Cited

OTHER PUBLICATIONS

Philips, Text Proposal for Spatial Temporal Turbo Channel Coding (STTCC), 3GPP, R1-050723, Sep. 2, 2005, the whole document.

ZTE, Rate matching improvement for turbo coding, 3GPP, R1-072101, May 11, 2007, the whole document.

Samsung, Bit interleaving to resolve Turbo coder irregularities in HSOPA, 3GPP, R1 030808, Aug. 29, 2003, the whole document.

* cited by examiner

| ODD-INDEXED $P'_1$ | EVEN-INDEXED $P'_1$ | ODD-INDEXED $P'_2$ | EVEN-INDEXED $P'_2$ | ODD-INDEXED $P'_3$ | EVEN-INDEXED $P'_3$ |
|---|---|---|---|---|---|

FIRST OUT ... LAST OUT

*FIG. 5*

COMPUTATIONALLY EFFICIENT CONVOLUTIONAL CODING WITH RATE-MATCHING

CROSS-REFERENCE TO RELATED APPLICATIONS

This application is a Continuation of U.S. patent application Ser. No. 13/412,402, filed on Mar. 5, 2012, which is a Continuation of U.S. Regular application Ser. No. 12/133,498, which was filed on Jun. 5, 2008 and which issued on Sep. 11, 2012 as U.S. Pat. No. 8,266,508, which claims the benefit of U.S. Provisional Application No. 60/942,770, filed on Jun. 8, 2007. The entire contents of each of the foregoing applications are incorporated herein by reference.

TECHNICAL FIELD

The present invention relates generally to error coding for mobile communications networks and, more particularly, to a method and apparatus for computationally efficient convolutional coding with rate matching.

BACKGROUND

Rate matching is a technique used in mobile communication systems to match a code rate of an encoder such as a convolutional encoder or turbo encoder to the data transmission rate of a communication channel. Rate matching typically involves puncturing or repeating coded bits output by the encoder to match the data transmission rate of the communication channel. Rate matching allows a single encoder to be used for a plurality of data channels with different data transmission rates.

In a conventional rate-matching circuit, an encoder receives an input bit stream and generates two or more coded bit streams. An interleaver interleaves each coded bit stream. A rate matching circuit bit-multiplexes the coded bits in each interleaved bit stream and outputs a single bit stream to the transmitter having a desired number of bits to match the data transmission rate of the communication channel. The bit-multiplexing performed by the rate matching circuit intermixes the interleaved bits from all interleaved bit streams. If the number of bits output by the encoder is greater than the number required, some of the interleaved bits are punctured. Conversely, if the number of bits output by the encoder is less than required, some of the bits may be repeated. The rate matching circuit may be implemented using a circular buffer, or a real-time multiplexing circuit.

While rate matching circuits used in the past provide good performance, there remains a need for new rate matching circuits for convolutional codes with lower complexity that provide good performance.

SUMMARY

The present invention relates to a method and apparatus for rate matching for use with a convolutional encoder. An information sequence is input to a non-systematic convolutional encoder. The convolutional encoder encodes the information sequence and outputs two or more parity bit streams. An interleaving circuit interleaves the parity bits in each parity bit stream without mixing the parity bits in different parity bit streams. The interleaved parity bits are input to a rate matching circuit. The rate matching circuit outputs a selected number of the parity bits to match the data channel. The parity bits are output in group order. That is, all of the parity bits from a first group of parity bits are output before any parity bits from the next group are output.

The method and apparatus for rate matching according to the present invention allows identical interleavers to be used for interleaving different parity bit streams output by the encoder, reduces the complexity of the channel encoder for mobile terminals, and improves the performance of channel encoding.

BRIEF DESCRIPTION OF THE DRAWINGS

FIG. 5 illustrates the order of the parity bits output by an exemplary rate matching circuit.

DETAILED DESCRIPTION

Figure 1:
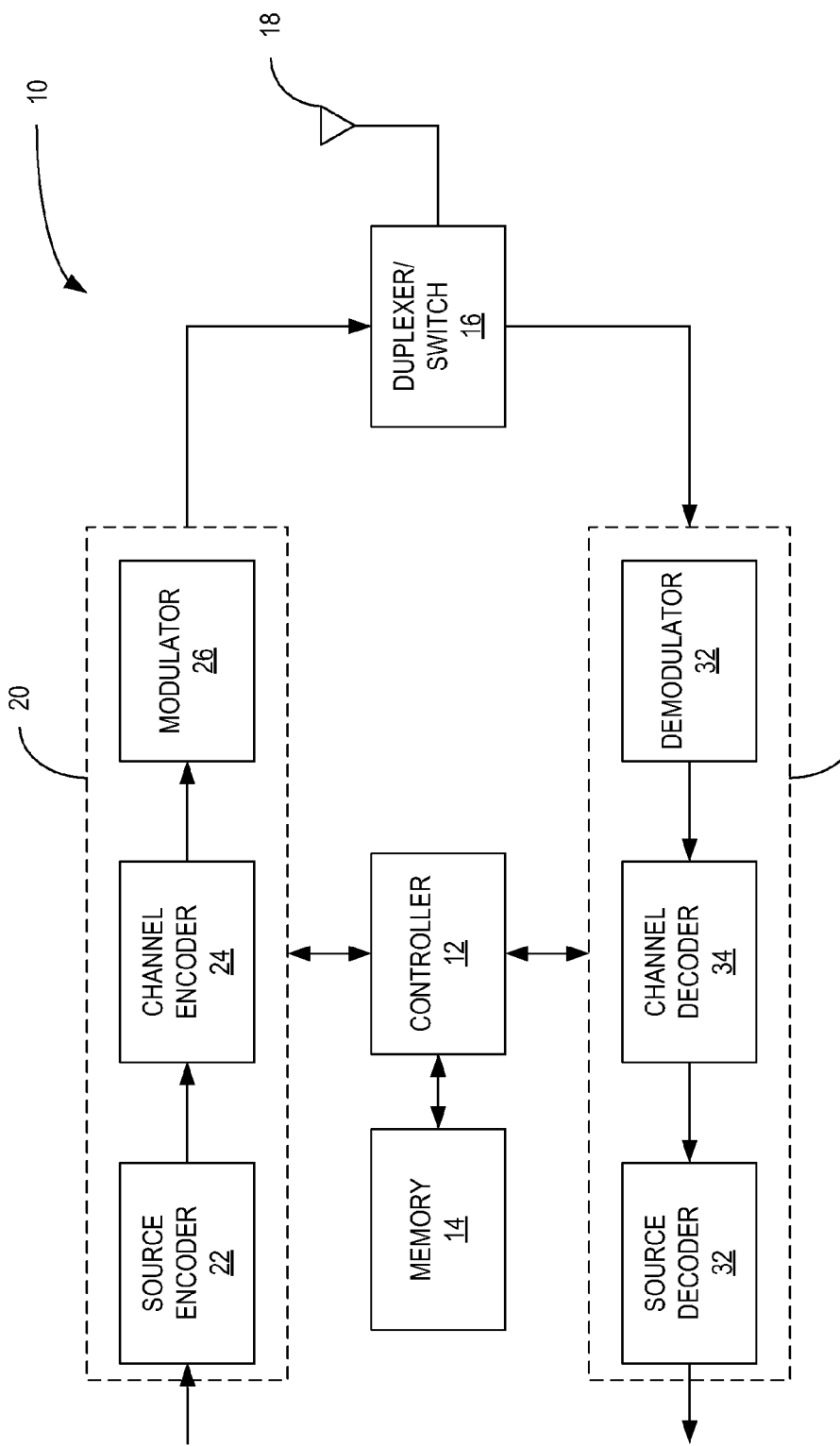
FIG. 1 illustrates an exemplary transceiver including a coding circuit.

FIG. 1 illustrates the main components of a communication terminal 10 for a mobile communication system. The communication terminal 10 comprises a system controller 12 to control the overall operation of the communication terminal 10, a memory 14 to store programs and data needed for operation, a transmitter 20 to transmit signals to a remote device, and a receiver 30 to receive signals from a remote device. The transmitter 20 and receiver 30 are coupled to one or more antennas 18 by a duplexer or switch 16 that permits full duplex operation.

The transmitter 20 receives an information stream from an information source, processes the information stream to generate a transmit signal suitable for transmission over a radio channel, and modulates the transmit signal onto an RF carrier. The transmitter 20 includes a source encoder 22, a channel encoder 24, and a modulator 26. The source encoder 22 removes redundancy or randomizes the information bit stream to produce an information sequence that is optimized for maximum information content. The information sequence from the source encoder 22 is passed to the channel encoder 24. The channel encoder 24 introduces an element of redundancy into the information sequence supplied by the source encoder 22 to generate a coded sequence. The redundancy added by the channel encoder 24 serves to enhance the error correction capability of the communication system. The output of the channel encoder 24 is the transmit sequence. The modulator 26 receives the transmit sequence from the channel encoder 24 and generates waveforms that both suit the physical nature of the communication channel and can be efficiently transmitted over the communication channel.

The receiver 30 receives signals transmitted from a far end device that has been corrupted by passage through the communication channel. The function of the receiver is to reconstruct the original information stream from the received signal. The receiver 30 includes a demodulator 32, a channel decoder 34, and a source decoder 36. The demodulator 32 processes the received signal and generates a received bit sequence, which may comprise hard or soft values for each received bit or symbol. If the received signal is transmitted without error through the communication channel, the received bit sequence would be identical to the transmit bit sequence at the transmitter. In actual practice, the passage of the received signal through the communication channel introduces transmission errors into the received signal. The channel decoder 34 uses the redundancy added by the channel encoder 24 at the transmitter 20 to detect and correct the bit errors. A measure of how well the demodulation 32 and a channel decoder 34 perform is the frequency with which bit errors occur in the decoded information sequence. As a final step, a source decoder 36 reconstructs the original information bit stream from the information source.

Figure 2:
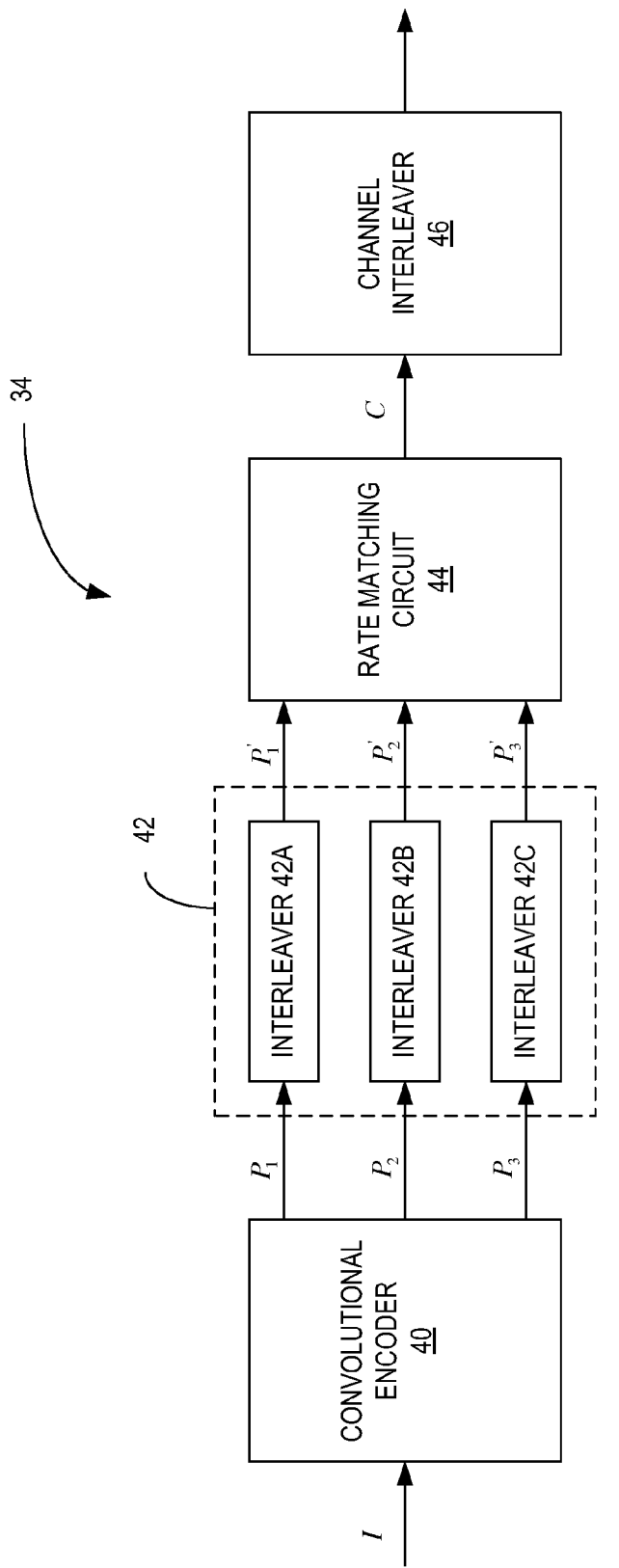
FIG. 2 illustrates a coding circuit according to one exemplary embodiment of the invention.

FIG. 2 illustrates an exemplary channel encoder 24 according to one embodiment of the invention. Channel encoder 24 includes an encoder 40, interleaving circuit 42, and a rate matching circuit 44. The channel encoder 24 may, in some embodiments, further include a channel interleaver 46 following the rate matching circuit 44.

The encoder 40 may comprise, for example, a non-systematic convolutional encoder. The encoder 40 receives an input sequence I and generates two or more parity bit streams $P_1$, $P_2$, ... $P_N$. As an example, the encoder 40 may implement a rate 1/3 tail-biting convolutional code with a constraint length k=7 and the generator polynomial $[133, 171, 165]_0$. This convolutional code belongs to the class of maximum free distance (MFD) codes with optimal distance spectra (ODS). This class of codes maximizes the free distances between code words and has the lowest weights at all distances. Another advantage of this convolutional code is that a rate 1/2 code can be obtained by puncturing the coded bits produced by the polynomial $[165]_0$. The resulting 1/2 rate convolutional code is given by the generator polynomial $[133,171]_0$. Those skilled in the art will appreciate that the nesting structure of the rate 1/3 and rate 1/2 convolutional codes can be utilized to reduce the complexity of the channel encoder 24.

The interleaving circuit 42 comprises three interleavers 42a, 42b, 42c to separately process the three parity bit streams from the convolutional encoder 40. Those skilled in the art will appreciate that each parity bit stream corresponds to one of the generator polynomials. The parity bit streams are denoted in FIG. 2 by $P_1$, $P_2$, and $P_3$. The parity bit stream $P_1$ corresponds to the generator polynomial $[133]_0$, the parity bit stream $P_2$ corresponds to the generator polynomial $[171]_0$, and the parity bit stream $P_3$ corresponds to the generator polynomial $[165]_0$. As will be described in greater detail below, group multiplexing of the parity bits allows identical interleavers 42a, 42b, 42c to be used for each of the parity bit streams $P_1$, $P_2$, $P_3$, respectively. The ability to use the same interleaver structure for each coded bit stream $P_1$, $P_2$, $P_3$ reduces the complexity of the channel encoder 24. In contrast, rate matching circuits that implement bit level multiplexing require that different interleavers be used for the different parity bit streams $P_1$, $P_2$, $P_3$. While the ability to use an identical interleaver for each parity bit stream is one advantage of the invention, those skilled in the art will appreciate that the interleaving circuit 42 could comprise different interleavers 42a, 42b, 42c for each of the parity bit streams.

The interleaved parity bit streams $P'_1, P'_2, P'_3$ output by interleavers 24a, 42b, 42c are input to the rate matching circuit 44. Rate matching circuit 44 performs group multiplexing of the parity bit stream $P'_1$, $P'_2, P'_3$ as hereinafter described and outputs an output sequence C. Additionally, the rate matching circuit 44 may puncture or repeat some of the parity bits to match the number of output bits to the data transmission channel.

As described above, the convolutional encoder 40 in the exemplary embodiment comprises a rate 1/3 convolutional code. Therefore, when a rate 1/3 convolutional code is required, the rate matching circuit 44 outputs all of the parity bits in all three parity bit streams. The rate matching circuit 44 outputs the parity bits in group-multiplexed format. That is, the rate matching circuit 44 outputs the parity bits corresponding to parity bit stream $P_1$ first, following by the parity bits in parity bit stream $P_2$, which is then followed by the parity bits in parity bit stream $P_3$. The parity bits in the three parity bit streams $P_1$, $P_2$, $P_3$ are not intermixed as in a conventional rate matching circuit, but instead are output in groups.

When a code rate higher than 1/3 is required to match the data communication channel, the rate matching circuit 44 outputs less than all of the parity bits by puncturing selected ones of the parity bits. When puncturing parity bits, the rate matching circuit 44 punctures parity bits corresponding to parity bit stream $P_3$ first, followed by parity bits corresponding to parity bit stream $P_2$. That is, no parity bits from parity bit stream $P_2$ are punctured until all of the parity bits from parity bit stream $P_3$ are punctured. The remaining parity bits which have not been punctured are output in group order as previously described. Thus, for a rate 1/2 convolutional code, the rate matching circuit 44 punctures all of the bits corresponding to parity bit stream $P_3$. To obtain a code rate between 1/2 and 1/3, the rate matching circuit 44 punctures some, but not all, of the parity bits corresponding to parity bit stream $P_3$. To obtain code rates greater than 1/2, the rate matching circuit 44 punctures all of the parity bits corresponding to parity bit stream $P_3$ and some of the parity bit streams corresponding to parity bit stream $P_2$.

When code rates less than 1/3 are required to match the data communication channel, the rate matching circuit 44 outputs the parity bits in each parity bit stream in $P_1$, $P_2$, $P_3$ group multiplexed order as previously described and then repeats the same output sequence in order until the desired number of bits have been output. That is, after all of the parity bits in all three parity bit streams $P_1$, $P_2$, $P_3$ have been output, the rate matching circuit 44 will output repeated parity bits corresponding to parity bit stream $P_1$ first, followed by repeated parity bits from parity bit stream $P_2$, then followed by parity bits from parity bit stream $P_3$ until the required number of parity bits is reached.

Figure 3:
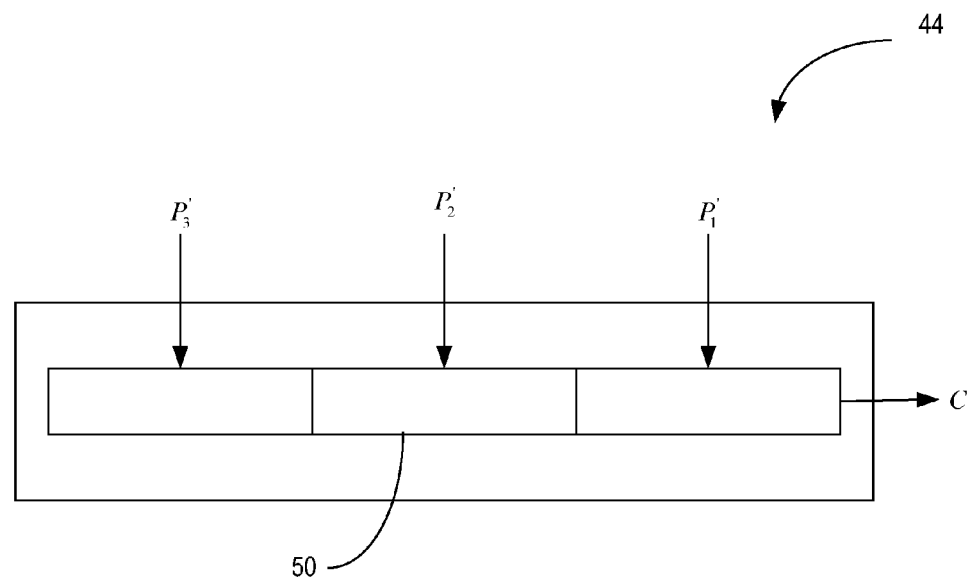
FIG. 3 illustrates a first exemplary rate-matching circuit according to one exemplary embodiment.
Figure 4:
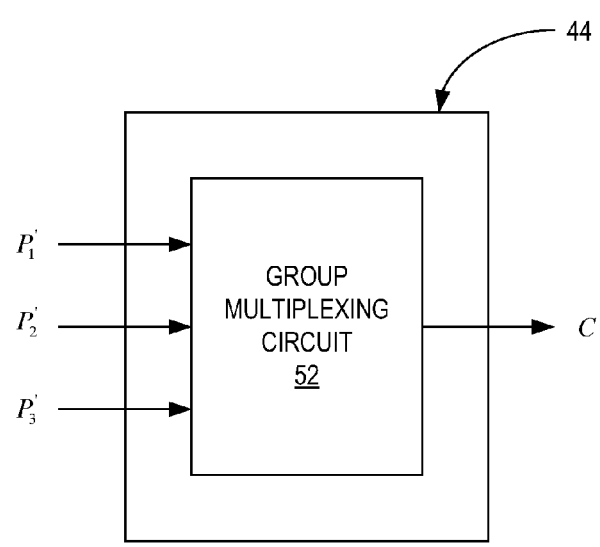
FIG. 4 illustrates a second exemplary rate-matching circuit according to another exemplary embodiment.

FIGS. 3 and 4 illustrate two exemplary implementations of the rate matching circuit 44. The rate matching circuit 44 shown in FIG. 3 includes a circular buffer 50. The interleaved parity bit streams $P'_1, P'_2, P'_3$, are read into corresponding sections of the circular buffer 50. Thus, the parity bits within the circular buffer 50 are ordered by group. The output bits of the rate matching circuit 44 are then read sequentially from the circular buffer 50. If the required number of bits is greater than the size of the circular buffer 50, the reading wraps from the end of the circular buffer 50 to the beginning.

In the embodiment shown in FIG. 4, a group multiplexing circuit 52 is used in place of the circular buffer 50. The group multiplexing circuit 52 generates interleaving addresses "on the fly" to read the parity bits from the three parity bit streams. This on-the-fly addressing generates the same output sequence C as the circular buffer 50 but without the need for buffering the output bits.

As previously noted, the group multiplexing implemented by the rate matching circuit 44 enables the same interleaver to be used for each of the parity bit streams $P_1$, $P_2$, and $P_3$. Bit reverse order (BRO) interleavers have been found to provide good performance for rate matching in turbo encoders. A length 32 BRO interleaver is given by:

BRO32=[0 16 8 24 4 20 12 28 2 18 10 26 6 22 14 30
 1 17 9 25 5 21 13 29 3 19 11 27 7 23 15 31]  Eq. 1

To accommodate arbitrary parity bit stream length, the BRO interleaver is commonly used as the column permutation pattern for a rectangular interleaver that is large enough to contain the parity bit stream. That is, for a parity bit stream of length $N_P$, the interleavers 42a, 42b, 42c are defined as rectangular interleavers of 32 columns and ceil($N_p/32$) rows. If the size of the rectangular interleaver (given by $N_I$=32*ceil($N_p/32$)) is larger than the parity bit stream length, $N_D=N_I-N_P$ dummy bits are padded to the front of the parity bit stream. The input stream (including parity bits and potentially dummy bits) are written into the interleaver row by row starting from the first row and first column. The 32 columns are then permuted based on the chosen column permutation pattern. After the column permutation, the contents of the interleaver can be read out column by column starting from the first column and the first row. Dummy bits, if present, are discarded when contents of the rectangular interleaver are read out.

For convolutional codes, the column-permuting BRO interleavers should preferably be modified so that odd-indexed bits in each parity bit group are output ahead of the even-indexed bits in the same parity bit group. The ordering of the parity bits is illustrated in FIG. 5.

In one exemplary embodiment, the interleavers 42a, 42b, 42c for the interleaving circuit 42 may comprise reverse BRO interleavers for column permutation. The reverse BRO interleaver is given by:

$$\text{R-BRO32} = [31\ 15\ 23\ 7\ 27\ 11\ 19\ 3\ 29\ 13\ 21\ 5\ 25\ 9\ 17\\ 1\ 30\ 14\ 22\ 6\ 26\ 10\ 18\ 2\ 28\ 12\ 20\ 4\ 24\ 8\ 16\ 0] \quad \text{Eq. 2}$$

The reverse BRO interleaver is implemented by modifying a conventional BRO interleaver so that the bits are output in a reverse order compared to a conventional BRO interleaver.

In a second embodiment, the interleavers 42a, 42b, 42c for the interleaving circuit 42 may comprise cyclically-shifted BRO interleavers for column permutation. One example of a cyclically-shifted BRO interleaver is given by:

$$\text{CS-BRO32} = [1\ 17\ 9\ 25\ 5\ 21\ 13\ 29\ 3\ 19\ 11\ 27\ 7\ 23\ 15\\ 31\ 0\ 16\ 8\ 24\ 4\ 20\ 12\ 28\ 2\ 18\ 10\ 26\ 6\ 22\ 14\ 30] \quad \text{Eq. 3}$$

The cyclically-shifted BRO interleaver is implemented by shifting the output bits of a conventional BRO interleaver by sixteen places.

In a third embodiment, the interleavers 42a, 42b, 42c for the interleaving circuit 42 may comprise a modulo-offset BRO interleaver for column permutation. An exemplary modulo-offset interleaver is given by:

$$\text{MO-BRO32} = [3\ 19\ 11\ 27\ 7\ 23\ 15\ 31\ 5\ 21\ 13\ 29\ 9\ 25\\ 17\ 1\ 4\ 20\ 12\ 28\ 8\ 24\ 16\ 0\ 6\ 22\ 14\ 30\ 10\ 26\ 18\ 2] \quad \text{Eq. 4}$$

The modulo-offset interleaver represented by Eq. 4 may be implemented by adding a predetermined offset to the output index of the conventional BRO interleaver modulo the length of the interleaver 42. The offset added to the interleaver addresses should be an odd number.

Because of the interleaving performed on the parity bit streams output from the encoder 40, the output sequence from the rate matching circuit 44 has a fairly randomized order. However, due to the group multiplexing of the rate matching circuit 44, there is no interleaving between the groups of parity bits. Therefore, in some circumstances, it may be desirable to include a channel interleaver 46 following the rate matching circuit 44 to improve the depth of the channel interleaving. For example, if the modulation format maps an even number of parity bits to each modulation symbol, it is possible to evenly divide the output bits from the rate matching circuit 44 into two sub-blocks ($c_0, c_1, c_{N/2-1}$) and ($c_{N/2}, c_{N/2+1}, c_{N-1}$). The two sub-blocks may then be bit multiplexed and sent to the modulator. Using QPSK modulation as an example, the first modulated symbol is determined by $c_0$ and $C_{N/2}$, the second modulation symbol is determined by $c_1$ and $C_{N/2+1}$ and so on.

Figure 6:
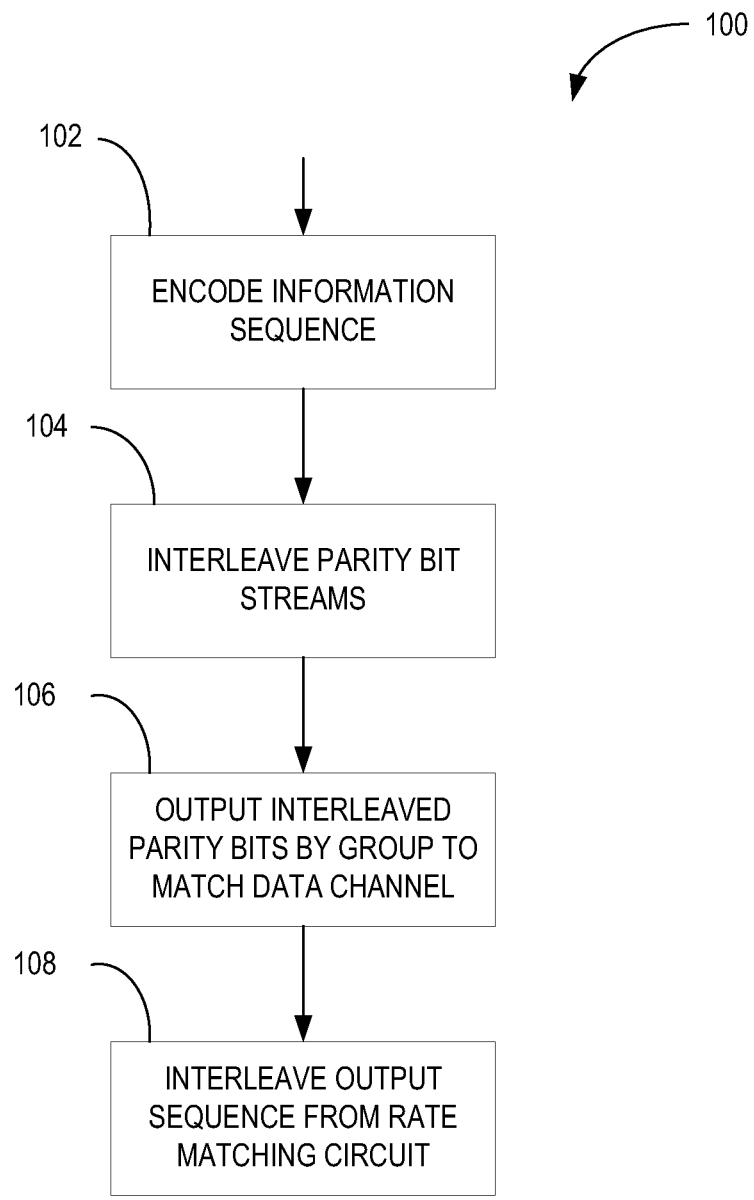
FIG. 6 illustrates an exemplary method for coding an input bit stream for transmission.

FIG. 6 illustrates an exemplary method 100 implemented by the channel encoder 24 according to one embodiment of the invention. Processing begins when an information sequence I is input to the channel encoder 24. The channel encoder 24 encodes the information sequence I to generate two or more parity bit streams (block 102). As previously noted, the encoding is performed by a non-systematic convolutional encoder. The parity bit streams $P_1, P_2, \ldots P_N$ are input to the interleaving circuit 42. The interleaving circuit 42 interleaves each parity bit stream to generate interleaved parity bit streams $P'_1, P'_2, \ldots P'_N$ (block 104). The interleaved parity bit streams are then supplied to the rate matching circuit 44. The rate matching circuit 44 outputs a selected number of the parity bits to match the data channel (block 106). The parity bits are output in group order as previously described. That is, all the parity bits corresponding to parity bit stream $P_1$ are output before any parity bits are output from the group corresponding to parity bit stream $P_2$, and so forth. If less than all of the parity bits are required to match the data channel, parity bits are punctured first from the group corresponding to parity bit stream $P_N$, before any parity bits are punctured from the group corresponding to parity bit stream $P_{N-1}$, and so forth. If the number of parity bits needed to match the data channel exceeds the number of parity bits output by the channel encoder 24, all of the parity bits are output ordered by group as previously described, and then the output sequence is repeated until the required number of parity bits has been reached. In some embodiments of the invention, the output sequence C from the rate matching circuit 44 may be interleaved by the channel interleaver 42 to improve the depth of interleaving (block 108). This final interleaving step is, however, optional.

While the present invention has been described in the context of a specific implementation, those skilled in the art will appreciate that the rate matching techniques described can be applied to encoders with different rates, and interleavers of different lengths. Further, while the preferred embodiment uses an identical interleaver for all three parity bit streams, it is possible to apply different interleavers to different parity bit streams.

The present invention may, of course, be carried out in other specific ways than those herein set forth without departing from the scope and essential characteristics of the invention. The present embodiments are, therefore, to be considered in all respects as illustrative and not restrictive, and all changes coming within the meaning and equivalency range of the appended claims are intended to be embraced therein.

What is claimed is:

1. An error coding circuit comprising:
   a non-systematic convolutional encoder for coding an input bit stream to produce two or more groups of parity bits;
   an interleaver circuit for interleaving parity bits within each group of parity bits, wherein the interleaver circuit is configured to order parity bits such that odd parity bits precede even parity bits within each group of parity bits; and
   a rate-matching circuit for outputting a selected number of said interleaved parity bits ordered by group to obtain a desired code rate.

2. The error coding circuit of claim 1, wherein said interleaver circuit implements a reverse bit-reversal order interleaver for column permutation.

3. The error coding circuit of claim 1, wherein said interleaver circuit implements a cyclically-shifted bit-reversal order interleaver for column permutation.

4. The error coding circuit of claim 1, wherein said interleaver circuit implements a modulo-offset bit-reversal order interleaver for column permutation.

5. The error coding circuit of claim 1, further comprising a channel interleaver following the rate-matching circuit.

6. An error coding circuit comprising:
   a non-systematic convolutional encoder for coding an input bit stream to produce two or more groups of parity bits;
   an interleaver circuit for interleaving parity bits within each group of parity bits; and
   a rate-matching circuit for outputting a selected number of said interleaved parity bits ordered by group to obtain a desired code rate, wherein said rate-matching circuit is configured to puncture parity bits, when the encoder produces more bits than needed to match a data communication channel, by puncturing up to all of the parity bits in one of the groups of parity bits before puncturing bits in any other group of parity bits.

7. The error coding circuit of claim 6, wherein the rate-matching circuit is configured to repeat parity bits, when the encoder produces fewer bits than needed to match a data communication channel, by repeating up to all of the parity bits in one of the groups of parity bits before repeating bits in any other group of parity bits.

8. A method for error coding an input bit stream, said method comprising:
   coding said input bit stream in a non-systematic convolutional encoder to produce two or more groups of parity bits;
   interleaving parity bits within each group of parity bits, such that odd parity bits precede even parity bits within each group of parity bits; and
   outputting a selected number of said interleaved parity bits ordered by group to obtain a desired code rate.

9. The method of claim 8, wherein said interleaving comprises a reverse bit-reversal order interleaving for column permutation.

10. The error coding circuit of claim 8, wherein said interleaving comprises a cyclically-shifted bit-reversal order interleaving for column permutation.

11. The error coding circuit of claim 8, wherein said interleaving comprises a modulo-offset bit-reversal order interleaving for column permutation.

12. A method for error coding an input bit stream, said method comprising:
   coding said input bit stream in a non-systematic convolutional encoder to produce two or more groups of parity bits;
   interleaving parity bits within each group of parity bits; and
   outputting a selected number of said interleaved parity bits ordered by group to obtain a desired code rate, wherein said outputting comprises puncturing parity bits, when said coding produces more bits than needed to match a data communication channel, by puncturing up to all of the parity bits in one of the groups of parity bits before puncturing bits in any other group of parity bits.

13. The error coding circuit of claim 12, wherein said outputting comprises repeating parity bits, when said coding produces fewer bits than needed to match a data communication channel, by repeating up to all of the parity bits in one of the groups of parity bits before repeating bits in any other group of parity bits.

14. An error coding circuit comprising:
   a non-systematic convolutional encoder for coding an input bit stream to produce three groups of parity bits, wherein said encoder implements a rate ⅓ tail-biting convolutional code belonging to the class of maximum free distance codes with optimal distance spectra, such that a rate ½ code belonging to the class of maximum free distance codes with optimal distance spectra can be obtained by puncturing one of the groups of parity bits;
   an interleaver circuit for interleaving parity bits within each group of parity bits; and
   a rate-matching circuit for outputting a selected number of said interleaved parity bits ordered by group to obtain a desired code rate.

15. The error coding circuit of claim 14, wherein said encoder implements a rate ⅓ tail-biting convolutional code with a constraint length k=7 and a generator polynomial $[133, 171, 165]_o$.

16. The error coding circuit of claim 14, wherein said encoder implements a rate ½ tail-biting convolutional code with a constraint length k=7 and a generator polynomial $[133, 171]_o$.

* * * * *

UNITED STATES PATENT AND TRADEMARK OFFICE
CERTIFICATE OF CORRECTION

| | | |
|---|---|---|
| PATENT NO. | : 8,607,130 B2 | Page 1 of 1 |
| APPLICATION NO. | : 13/687903 | |
| DATED | : December 10, 2013 | |
| INVENTOR(S) | : Cheng | |

It is certified that error appears in the above-identified patent and that said Letters Patent is hereby corrected as shown below:

On Title Page 2, Item (56), under "OTHER PUBLICATIONS", in Column 2, Line 4, delete "HSOPA," and insert -- HSDPA, --, therefor.

In the Drawings

In Fig. 1, Sheet 1 of 5, delete "SOURCE DECODER 32" and insert -- SOURCE DECODER 36 --, therefor.

In the Specification

In Column 5, Line 6, delete "($N_p$/32)" and insert -- ($N_P$/32) --, therefor.

Signed and Sealed this
Twenty-second Day of July, 2014

Michelle K. Lee
*Deputy Director of the United States Patent and Trademark Office*

UNITED STATES PATENT AND TRADEMARK OFFICE
CERTIFICATE OF CORRECTION

PATENT NO. : 8,607,130 B2
APPLICATION NO. : 13/687903
DATED : December 10, 2013
INVENTOR(S) : Jung-Fu Cheng Page 1 of 1

It is certified that error appears in the above-identified patent and that said Letters Patent is hereby corrected as shown below:

In the Claims

In Column 7, Line 42, delete "error coding circuit" and insert -- method --, therefor.

In Column 8, Line 1, delete "error coding circuit" and insert -- method --, therefor.

In Column 8, Line 17, delete "error coding circuit" and insert -- method --, therefor.

Signed and Sealed this
Eighth Day of December, 2020

Andrei Iancu
*Director of the United States Patent and Trademark Office*